United States Patent [19]

Yamaguchi et al.

[11] Patent Number: 4,535,306
[45] Date of Patent: Aug. 13, 1985

[54] PHASE-LOCKED LOOP DETECTING CIRCUIT

[75] Inventors: Tadahiro Yamaguchi; Ryuichi Naito, both of Saitama, Japan

[73] Assignee: Pioneer Electronic Corporation, Tokyo, Japan

[21] Appl. No.: 517,554

[22] Filed: Jul. 27, 1983

[30] Foreign Application Priority Data

Jul. 27, 1982 [JP] Japan .................. 57-131008

[51] Int. Cl.$^3$ .................. H03L 7/00
[52] U.S. Cl. .................. 331/23; 331/25; 329/122
[58] Field of Search .................. 331/DIG. 2, 23, 25; 329/50, 122

[56] References Cited

U.S. PATENT DOCUMENTS 3,525,945  8/1976  Puente .................. 331/DIG. 2 X
4,473,801  9/1984  Maurer et al. .................. 329/122 X Primary Examiner—Eugene R. LaRoche
Assistant Examiner—Robert J. Pascal
Attorney, Agent, or Firm—Sughrue, Mion, Zinn, Macpeak and Seas

[57] ABSTRACT

A circuit for detecting a proper locked state between the output of a phase-locked loop clock generating circuit and a timing component of a received composite signal containing both digital information and the timing component. An internal synchronization pulse signal is produced directly in response to the output of the phase-locked loop, and a frame synchronization sequence detection pulse signal is produced by detecting the occurrence of frame synchronization sequences in the composite signal. The internal synchronization pulse signal and the frame synchronization sequence detection pulse signal are compared to determine whether or not they are in time coincidence. If they are not, corresponding to an improperly locked state, a synchronization hunting controller controls the internal synchronization pulse generator to shift the phase of the internal synchronization pulse signal until time coincidence occurs. The output of the synchronization hunting controller is also used a lock detection signal. A frame synchronization signal is produced by delaying the output of the internal synchronization pulse generator.

8 Claims, 5 Drawing Figures

PHASE-LOCKED LOOP DETECTING CIRCUIT

BACKGROUND OF THE INVENTION

The present invention relates to a circuit for generating a clock signal from a composite received signal including both digital information and a timing component such as a frame synchronizing sequence. More particularly, the invention relates to such a clock generating circuit in which the locking state of a phase-locked loop used in the generation of the clock signal is detected and corrected as needed.

A so-called "eight-to-fourteen" modulation system, hereinafter referred to simply as an EFM system, has been employed in the transmission of digital data at high data rates. The digital data may be modulated according to the well-known PCM (Pulse Code Modulation) technique, and the modulation system may be applied to either data recorded on a recording medium such as a video disc or data transmitted over a communication link. In the demodulation of such signals, it has been customary to employ a phase-locked loop circuit to recover the clock signal from the composite information and timing signal in order to obtain a stable clock signal for use in clocking the recovered digital data. Such circuits suffer a significant drawback in that it sometimes occurs that the phase-locked loop circuit will lock onto other than the timing component in the composite received signal. In such a case, it is impossible to properly process the received digital data for lack of a clocking signal which has the proper frequency relationship to the digital data and which has pulses in the desired phase relationship thereto. Thus, in order to detect the fact that the phase-locked loop circuit has locked onto an incorrect component in the received signal, it is necessary to discriminate a properly locked state from a mislocked state.

With reference now to the block diagram of FIG. 1, a conventional phase-locked loop clock generating circuit which is capable of making the desired discrimination between locking states is shown. The received composite signal is applied to the input of an edge detector 1. The edge detector 1 generates a pulse for both rising and falling edges of the received composite signal. The output of the edge detector is fed to inputs of phase comparators 2 and 3. The composite signal in this case may be a signal read from a video disc which contains digital information representing both video and audio information and a frame synchronizing sequence. As per the usual construction, the phase-locked loop circuit 6 includes a phase comparator 2, loop filter 4 and voltage-controlled oscillator 5. The output of the edge detector 1 is compared with the output of the voltage controlled oscillator 5 by the phase comparator 2. The result of this comparison, a signal representing the difference in frequency and phase between the two signals, is applied through the loop filter 4 to the input of the voltage-controlled oscillator 5. The output of the voltage-controlled oscillator is applied to a decoding circuit (not shown) as the recovered clock signal, and also to the second input of the phase comparator 2 and to the input of a phase shifter 7. The phase shifted signal produced by the phase shifter 7 is compared with the output of the edge detector 1 by the phase comparator 3. The output signal from the phase comparator 3, representing the difference in phase between the output of the edge detector 1 and the output of the phase shifter 7, is applied to the input of a low-pass filter 8, and thence to a level comparator 9. The level comparator 9 compares the output of the low-pass filter 8 with a predetermined reference level and thereby produces a binary signal which indicates whether the output from the low-pass filter 8 is greater than or less than the reference level.

When the phase-locked loop circuit 6 has locked onto a signal, the phase difference seen by the phase comparator 2 is approximately zero. However, the phase difference seen by the phase comparator 3 is nonzero due to the phase difference imparted by the phase shifter 7. If the phase shift of the phase shifter is properly chosen, the output of the phase comparator 3 will be a maximum when the phase-locked loop is in its locked state. The output from the low-pass filter 8 will then exceed the predetermined reference level, and the output of the level comparator 9 will be in a state indicative of the locked state of the phase-locked loop circuit 6. In the described circuit, the phase shift imparted by the phase shifter 7 should be 90° in the case that the phase comparators 2 and 3 are constructed so that maximum outputs therefrom are obtained when the input signals thereto differ in phase from one another by 90°.

Although the conventional system described above was in fact capable of making a discrimination between the locked and unlocked states of the phase-locked loop, nevertheless, it was not fully acceptable for many applications because, if the received signal contained a high frequency component in the same frequency range as the timing signal, the phase-locked loop could erroneously lock onto the wrong signal component and hence generate an erroneous clock signal.

This effect will now be explained in more detail with reference to the timing diagram of FIG. 2 which shows the waveform of a reproduced signal obtained from an optically recorded audio disc on which the audio information has been recorded using both PCM and EFM. As indicated in FIG. 2, one frame is composed of a predetermined number of bits, here assumed to be 588 bits. The 588-bit frame is converted into a format of eight bytes, each composed of 14 bits. Three parity bits are added to each 14-bit byte to make a total of 17 bits. The resulting signal is recorded according to the NRZI system whereby a change from a high logic level to low logic level is indicative of an information bit in the "1" state and a change from a low logic level to a high logic level corresponds to an information bit in the "0" state.

A frame synchronizing sequence is recorded by recording bits in particular locations in predetermined states. For the example presently under discussion, the first bit of each frame is a 1, the second to the eleventh bits are 0, the twelfth bit is 1, the thirteenth to the twenty-second bits are 0, and the twenty-third bit is 1. A control signal is disposed at a predetermined position relative to the frame synchronizing sequence. Signal processing is carried out such that not less than two or more than ten 0s are located between 1s. That is, the minimum bit reversal time is set to be 3T, where T is the period of a single bit of the 588-bit frame. As further indicated in FIG. 2, the maximum reversal interval is set to be 11T. The signal processing technique employed further assumes that no two maximum reversal intervals occur sequentially except for in the frame synchronizing sequence. Also, the states of the bits of the frame synchronizing sequence can be made to reverse for every other frame synchronizing sequence.

In "silent" portions of the disc, such as in the lead-in and lead-out grooves and during intersong intervals, the recorded signal will have a fixed pattern, having a sequence such as 7T, 3T, 7T . . . , repeating each 17 bits. When the corresponding recovered composite signal is demodulated, it will thus include a high frequency component which can be mistaken for the frame synchronizing sequence. More particularly, in a case where the frame bit rate is 4.3218 MHz, spurious signal components will be generated at frequencies of 4.3218±n×254 KHz, where 254 KHz=4.3218 MHz÷17, and n is an integer. If one of these components near in frequency to the frame synchronizing sequence has sufficient energy, the phase-locked loop circuit may lock onto the spurious component, causing the output from the level comparator 9 to be set in the state indicative of actual lock. This is, of course, an erroneous indication. Because in this system the clock signal is used to control the rotation speed of the disc, the speed of the disc may become erroneous, thus making it very difficult to ever properly recover the true clock signal. The conventional arrangement is thus disadvantageous in this respect. Also, it may noted that the prior art arrangement requires a rather cumbersome and complex circuit arrangement due to the necessity for providing the phase comparator 3, the phase shifter 7, the low-pass filter 8 and the level comparator 9.

It is thus an object of the invention to provide a clock generating circuit for use in recovering a clock signal using a phase-locked loop in which spurious lock of the phase-locked loop circuit is avoided.

It is a further object of the invention to provide such a clock generating circuit in which few components in addition to those necessary for the phase-locked loop circuit itself are required.

SUMMARY OF THE INVENTION

These, as well as other objects of the present invention, are met by a clock generating circuit employing a phase-locked loop in which the proper locked state is detected by the fact that a frame synchronizing control circuit has ceased a hunting operation.

More specifically, the invention provides a clock generating circuit employing a phase-locked loop in which an internal synchronizing pulse signal is produced by counting pulses of the clock signal produced by the phase-locked loop. Further, a frame synchronizing pulse signal is produced by detecting, with the use of the clock signal produced by the phase-locked loop, the presence of a frame synchronizing pulse signal in a decoded composite received signal. The internal synchronizing pulse signal and the frame synchronizing pulse signal are applied to a synchronization timing comparator which determines whether the pulses of the two signals are in time coincidence. If they are not, a synchronization hunting controller circuit is activated which causes the internal synchronization pulse generator to vary the phase of the internal synchronizing pulse signal. The output of the synchronization hunting controller also is used as a lock detecting signal.

DESCRIPTION OF THE PREFERRED EMBODIMENTS

The invention will now be described in more detail with reference to FIGS. 3 through 5 of the drawings.

Figure 1:
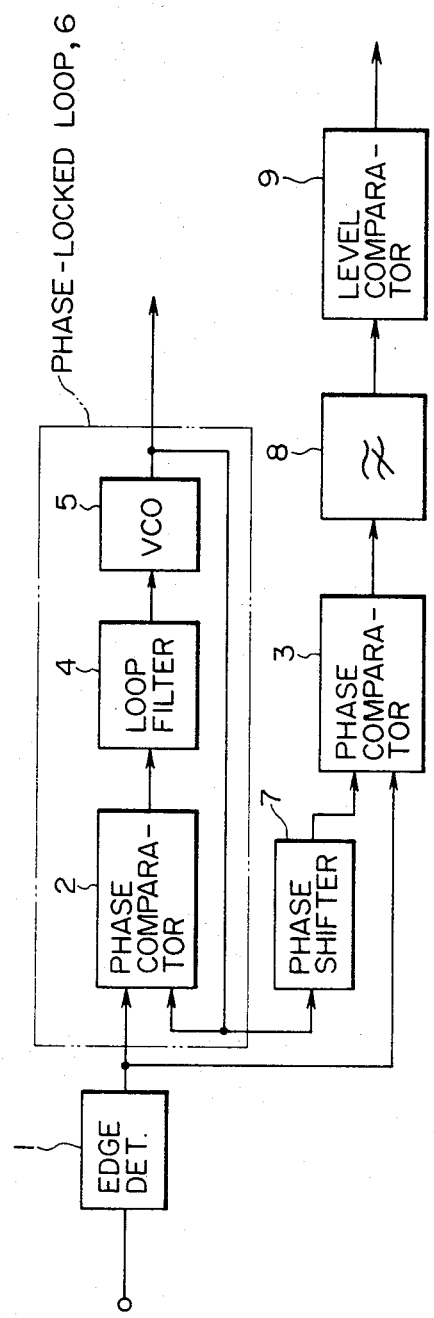
FIG. 1 is a block diagram of a prior art clock signal generator of the same general type to which the invention pertains.
Figure 2:
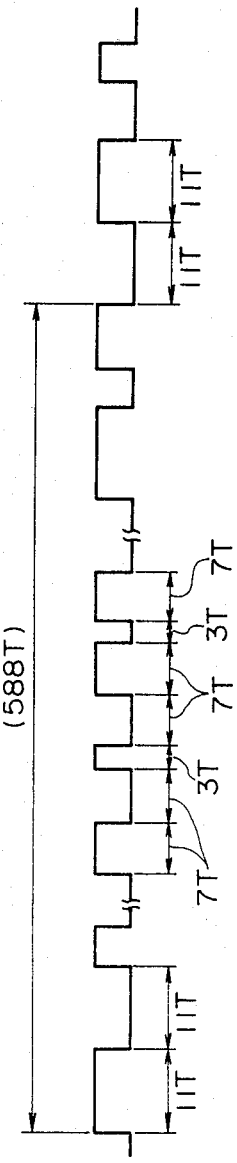
FIG. 2 is a waveform diagram showing a format of an input signal to the circuit of FIG. 1.
Figure 3:
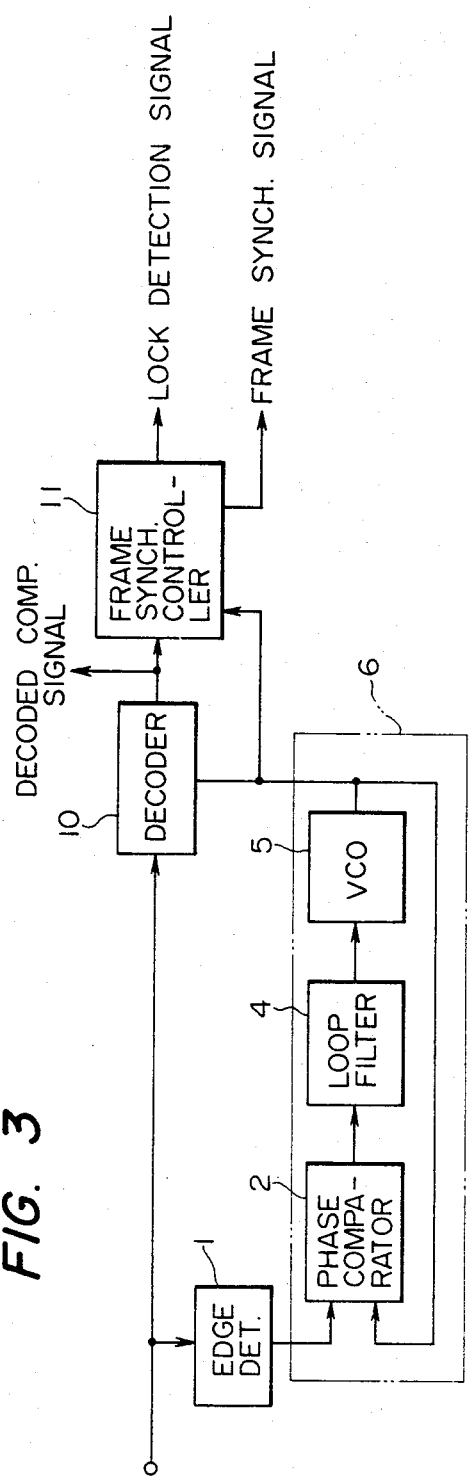
FIG. 3 is a block diagram showing a preferred embodiment of a clock signal generating circuit of the present invention.

With reference first to FIG. 3, the clock generating circuit of the invention includes an edge detector 1 and a phase-locked loop 6 connected in the same configuration as that utilized in the circuit of FIG. 1. The output clock signal from the phase-locked loop 6 is applied to one input of a decoder 10, the other input of which is supplied by the received composite signal applied to the input of the edge detector 1. The decoder 10 thus decodes (demodulates) the received composite signal utilizing the clock signal produced by the phase-locked loop 6, producing thereby a decoded composite signal. The decoded composite signal and the output from the phase-locked loop 6 are applied to a frame synchronization controller 11. It is the function of the frame synchronization controller 11 to produce a lock detection signal which indicates whether or not a proper locked state has been attained, and also a frame synchronization signal which marks the presence of the frame synchronization sequence of the decoded composite signal.

Figure 4:
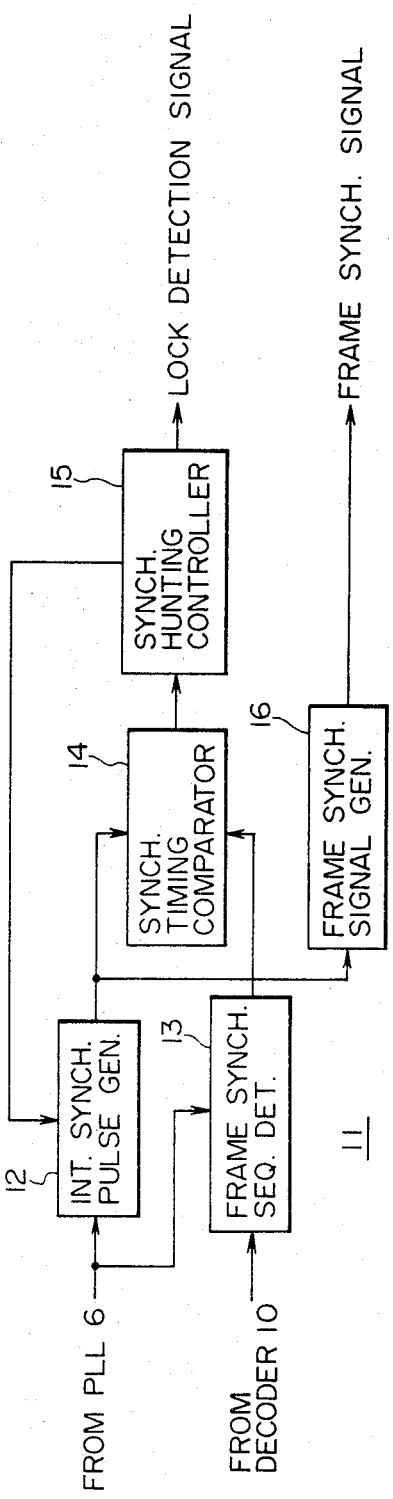
FIG. 4 is block diagram showing a frame synchronization controlling circuit utilized in the circuit of FIG. 3.

With reference now to FIG. 4, the construction of the frame synchronization controller 11 will be described in more detail. The clock output from the phase-locked loop is applied to an internal synchronization pulse generator 12 which produces an output signal with a timing corresponding to the frame synchronization signal when proper lock has been achieved. A frame synchronization signal detector 13 receives the decoded composite signal from the output of the decoder 10, and from this signal, with the use of the clock signal from the phase-locked loop 6, detects the occurrence of the frame synchronization sequence contained within the decoded composite signal.

The outputs from the internal synchronization pulse generator 12 and frame synchronization sequence detector 13 are applied to respective inputs of a synchronization timing comparator 14. When the two pulse signals from the outputs of the circuits 12 and 13 are in time coincidence, the synchronization timing comparator 14 outputs a high logic level, otherwise, the comparator 14 outputs a low logic level. When a high logic level signal is being produced by the synchronization timing comparator 14 indicative that proper lock has not been found, the synchronization hunting controller 15 produces an output which is fed back to the internal synchronization pulse generator 12 which causes the latter to continuously vary the phase of the internal synchronization pulse signal produced thereby until the synchronization timing comparator 14 produces an output signal indicative of the fact that a proper phase lock has been found. The synchronization hunting controller 15 also produces the lock detection signal which indicates to the associated processing circuitry whether or not the proper locked state has been found.

Further, a frame synchronization signal generator 16 is provided which produces the frame synchronization signal referred to above. This is done merely by delaying the output of the internal synchronization pulse generator 12. When a proper phase locked state has been found, the pulse output from the frame synchronization signal generator 16 will mark the occurrence of the frame synchronization sequence.

Figure 5:
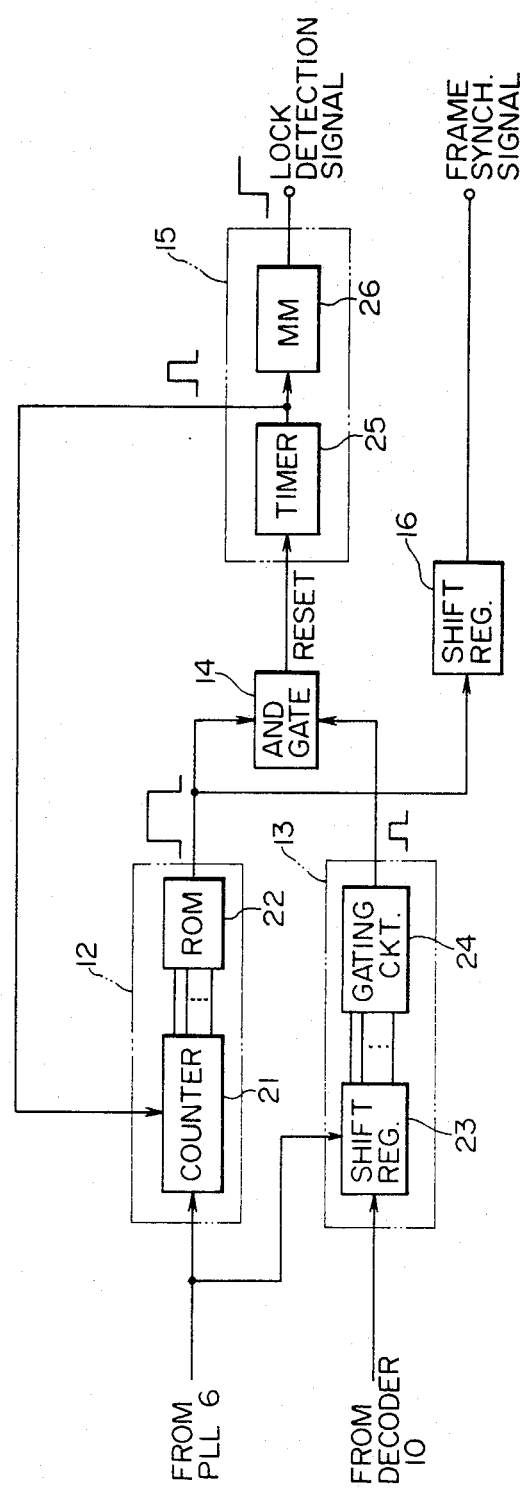
FIG. 5 is a detailed diagram of the circuitry shown in FIG. 4.

The structure of the circuitry of FIG. 4 is shown in more detail in FIG. 5. The internal synchronization pulse generator 12 includes a counter 21 which is returned to an initial state when 588 bits (one frame of bits) have been counted, and a ROM 22 which receives the outut of the counter 21 as an address signal.

The frame synchronization sequence detector 13 includes a shift register 23 which sequentially shifts the decoded composite signal using the clock signal produced by the phase-locked loop 6, and a gating circuit 24 which detects whether the content of the shift register is a bit pattern corresponding to the predetermined frame synchronization sequence.

The synchronization timing comparator 14 is implemented with an AND gate. The AND gate is enabled during periods when the outputs from both the internal synchronization pulse generator 12 and the frame synchronization signal detector 13 are at high logic levels. The output of the AND gate 14 is applied to the synchronization hunting controller 15 to detect the occurrence of coincidence between the internal synchronization pulse signal and the frame sequence detection pulse signal. The synchronization hunting controller 15 includes a timer 25 and a retriggerable monostable multivibrator 26. The timer 25 produces a pulse signal having high-level pulses occurring with a period $T_1$, with $T_1$ being longer than the duration of the frame synchronization sequence. The output of the AND gate of the synchronization timing comparator 14 is applied as a reset signal to the timer 25. The monostable multivibrator 26 produces a low level signal having a period $T_2$ ($T_2 > T_1$) when triggered by the high-level signal fed from the timer 25.

The frame synchronization signal generator 16 is implemented with a shift register with which the internal synchronization pulse signal produced at the output of the internal synchronization pulse generator 12 is delayed.

In operation, when the phase-locked loop 6 is not properly locked, the pulses of the internal synchronization pulse signal and the frame sequence detection pulse signal will not be time coincident. Hence, no high level signal is produced by the AND gate of the synchronization timing comparator 14. Thus, the timer 25 will not be reset, and a high-level pulse signal will be outputted by the timer 25 with the period $T_1$. In this case, a hunting operation will be carried out. Also, the monostable multivibrator 26 will be triggered periodically at the period $T_1$, and, accordingly, the multivibrator 26 continuously outputs a low-level signal due to the fact that the period $T_1$ is shorter than $T_2$.

In the case where the internal synchronization pulse signal and the frame sequence detection pulse signal have the same period but different phases, the counter 21 will be reset in response to the output of the timer 25. In this case, phase shifting corresponding to ($588T - T_1$) repeatedly takes place at the period $T_1$. The phases of the two pulse signals will at some point become equal as the counter 21 is advanced. At such time, the high level reset signal will be applied to the timer 25 from the AND gate of the synchronization timing comparator 14. At the instant that coincidence occurs, the supply of clock pulses to the counter 21 is stopped.

When the phase-locked loop is properly locked, high-level pulses are outputted by the AND gate at the period of 588T. In response to these pulses, the timer 25 is repeatedly reset at an interval less than $T_1$. Hence, no pulses are produced by the timer 21. Since no trigger signal is then applied to the monostable multivibrator, the output of the latter, the lock detection signal, remains at the high level.

This concludes the description of the preferred embodiments of the invention. Although preferred embodiments have been described, it is believed that numerous modifications and alterations thereto will be apparent to one of ordinary skill in the art without departing from the spirit and scope of the invention. For instance, although the invention has been described with reference to an optical audio disc player, the present invention is also applicable to any apparatus employing a phase-locked loop for producing aa reproduced clock from a digital signal including a timing component.

We claim:

1. An apparatus for detecting the occurence of proper phase lock between the output of a phase-locked loop and a received composite signal containing a timing component, comprising:
    means for producing a frame synchronization sequence detection signal having pulses in synchronization with the occurrence of frame synchronization sequences in said composite signal;
    means for producing an internal synchronization pulse signal in response to said output of said phase-locked loop, said internal synchronization pulse signal having a phase determined in accordance with a control signal supplied to said means for producing said internal synchronization pulse signal;
    means for detecting whether or not pulses of said internal synchronization pulse signal and said frame synchronization sequence detection signal are in time coincidence and producing a reset signal when time coincidence occurs and no reset signal otherwise; and
    synchronization hunting controller means operating in response to said reset signal for producing a control signal and a lock detection signal, said control signal being applied to said internal synchronization pulse generator.

2. The apparatus of claim 1, further comprising frame synchronization signal generating means operating in response to said internal synchronization pulse signal for producing a frame synchronization signal marking occurrence of said frame synchronization sequences.

3. The apparatus of claim 1, wherein said internal synchronization pulse generator comprises:
    a counter receiving as a clock input said output of said phase-locked loop, and as a reset input said control signal; and
    a read-only memory receiving as an address input an output from said counter.

4. The apparatus of claim 3, wherein said frame synchronization sequence detector comprises:
    a shift register receiving on a serial input thereof a decoded composite signal and as a clock signal said output from said phase-locked loop; and
    a gating circuit for detecting when outputs of said shift register are in predetermined states.

5. The apparatus of claim 4, wherein said detecting means comprises an AND gate.

6. The apparatus of claim 5, wherein said synchronization hunting controller means comprises:
   a timer receiving as a reset input an output from said AND gate; and
   a monostable multivibrator, a trigger input of said monostable multivibrator being coupled to an output of said timer, said output of said timer forming said control signal.

7. The apparatus of claim 6, wherein a period of clock pulses produced by said timer is shorter than a pulse duration produced upon triggering said monostable multivibrator.

8. The apparatus of claim 2, wherein said frame synchronization signal generating means comprises a shift register.

* * * * *